United States Patent
Morimoto et al.

(10) Patent No.: US 7,786,480 B2
(45) Date of Patent: Aug. 31, 2010

(54) SYSTEM FOR DISPLAYING IMAGES INCLUDING THIN FILM TRANSISTOR DEVICE AND METHOD FOR FABRICATING THE SAME

(75) Inventors: Yoshihiro Morimoto, Hsinchu (TW); Ryan Lee, Hualien (TW); Hanson Liu, Kaohsiung (TW); Feng-Yi Chen, Changjhih Township (TW)

(73) Assignee: TPO Displays Corp., Chu-Nan (TW)

( * ) Notice: Subject to any disclaimer, the term of this patent is extended or adjusted under 35 U.S.C. 154(b) by 545 days.

(21) Appl. No.: 11/502,842

(22) Filed: Aug. 11, 2006

(65) Prior Publication Data
US 2008/0035995 A1    Feb. 14, 2008

(51) Int. Cl.
*H01L 31/00*    (2006.01)
(52) U.S. Cl. .................... 257/59; 257/72; 257/E27.001
(58) Field of Classification Search .................. 257/59, 257/72
See application file for complete search history.

(56) References Cited

U.S. PATENT DOCUMENTS

| | | | |
|---|---|---|---|
| 6,380,560 B1 * | 4/2002 | Yamazaki et al. | 257/72 |
| 2001/0017371 A1 * | 8/2001 | Tanaka et al. | 257/59 |
| 2004/0185607 A1 * | 9/2004 | Shih et al. | 438/151 |
| 2006/0081844 A1 * | 4/2006 | Hirosue et al. | 257/59 |
| 2006/0131587 A1 * | 6/2006 | Sato et al. | 257/72 |
| 2008/0017937 A1 * | 1/2008 | Morimoto et al. | 257/411 |

* cited by examiner

*Primary Examiner*—Kenneth A Parker
*Assistant Examiner*—Anthony Ho
(74) *Attorney, Agent, or Firm*—Liu & Liu

(57) ABSTRACT

A system for displaying images. The system comprises a thin film transistor (TFT) device comprising a substrate having a pixel region. An active layer is disposed on the substrate of the pixel region, comprising a channel region, a pair of source/drain regions separated by the channel region. The channel region comprises dopants with a first conductivity type and a second conductivity type opposite to the first conductivity type. A gate structure is disposed on the active layer, comprising a stack of a gate dielectric layer and a gate layer. A method for fabricating a system for displaying images including the TFT device is also disclosed.

20 Claims, 4 Drawing Sheets

“SYSTEM FOR DISPLAYING IMAGES INCLUDING THIN FILM TRANSISTOR DEVICE AND METHOD FOR FABRICATING THE SAME”

BACKGROUND OF THE INVENTION

1. Field of the Invention

The invention relates to a flat panel display technology, and in particular to an improved thin film transistor (TFT) device having different electrical characteristics in driving circuit and pixel regions and a method for fabricating the same.

2. Description of the Related Art

The demand for active-matrix flat panel displays, such as active matrix organic light emitting device (AMOLED) displays, has increased rapidly in recent years. AMOLEDs typically employ thin film transistors (TFTs) as pixel and driving circuit switching elements which are classified as amorphous silicon (a-Si) TFTs and polysilicon TFTs according to the materials used as an active layer. Compared with a-Si TFTs, polysilicon TFTs have the advantages of high carrier mobility, high driving-circuit integration and low leakage current, and are often applied to high-speed operation applications. Thus, low temperature polysilicon (LTPS) is a novel application for FPD technology. LTPS allows for an easier IC manufacturing process, which integrates driving circuits on a glass substrate having pixels thereon, reducing the manufacturing cost.

In the LTPSTFT fabrication, the TFTs in the driving circuit region and the pixel region are fabricated at the same time and by the same process. Therefore, the TFTs in the pixel and driving circuit regions have the same electrical characteristics. In AMOLED, however, the electrical characteristics of the TFTs in the driving circuit region are different from that in the pixel region. For example, it is desirable to design driving TFTs with high carrier mobility and low sub-threshold swing for proving fast response. Additionally, it is desirable to design pixel TFTs with high sub-threshold swing to increase gray scale inversion of the AMOLED, thereby providing high contrast ratio. However, it is difficult to fabricate TFTs with high sub-threshold swing for a pixel region and low sub-threshold swing and high carrier mobility for a driving circuit region because they are fabricated at the same time and by the same process. That is, in conventional LTPSTFT fabrication, the electrical characteristics of TFTs in the driving circuit region are degraded when the gray scale inversion for the pixel region is increased. Conversely, the gray scale inversion for the pixel region is reduced when the electrical characteristics of TFTs in the driving circuit region are improved.

Thus, there exists a need in the art for development of an improved thin film transistor device which has different TFT electrical characteristics in the driving circuit and pixel regions, thereby providing pixel TFTs with high sub-threshold swing without degrading the electrical characteristics of drive TFTs.

BRIEF SUMMARY OF THE INVENTION

A detailed description is given in the following embodiments with reference to the accompanying drawings. A system for displaying images and a method for fabricating the same are provided. An embodiment of a system for displaying images comprises a thin film transistor (TFT) device comprising a substrate having a pixel region. An active layer is disposed on the substrate of the pixel region, comprising a channel region, a pair of source/drain regions separated by the channel region. The channel region comprises dopants with a first conductivity type and a second conductivity type opposite to the first conductivity type. A gate structure is disposed on the active layer, comprising a stack of a gate dielectric layer and a gate layer.

An embodiment of a method for fabricating a method for fabricating a system for displaying images is provided, wherein the system comprises a thin film transistor device and the method comprises providing a substrate comprising a driving circuit region and a pixel region. A polysilicon layer is formed on the substrate of the driving circuit and pixel regions. The polysilicon layer in the driving circuit region is covered by a masking layer. Ion implantation of a first conductivity type is performed in the polysilicon layer in the pixel region. Ion implantation of a second conductivity type opposite to the first conductivity type is performed in the polysilicon layer in the pixel region, such that the polysilicon layer in the pixel region comprises dopants with the first and second conductivity types. The polysilicon layer is annealed to activate the dopants after the masking layer is removed.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1A:
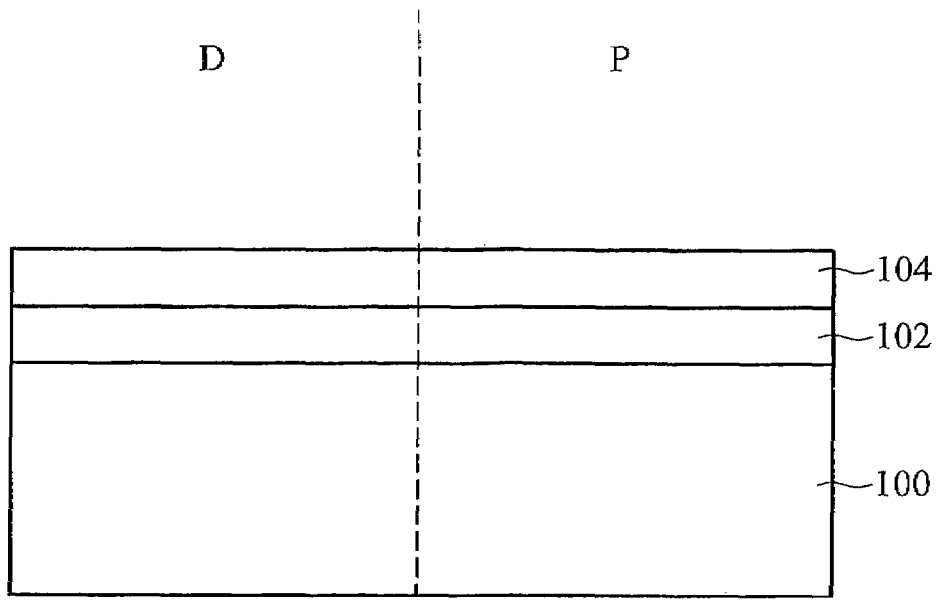
FIGS. 1A to 1F are cross sections of an embodiment of a method for fabricating a system for displaying images incorporating a thin film transistor device.

The following description is of the best-contemplated mode of carrying out the invention. This description is made for the purpose of illustrating the general principles of the invention and should not be taken in a limiting sense. The scope of the invention is best determined by reference to the appended claims.

Systems for displaying images and fabrication methods for same are provided. FIG. 1F illustrates an exemplary embodiment of such a system. Specifically, the system incorporates a thin film transistor (TFT) device comprising a substrate 100 comprising a driving circuit region D and a pixel region P. A buffer layer 102 may be optionally disposed on the substrate 100 to serve as an adhesion layer or a contamination barrier layer between the substrate 100 and the subsequent active layer. An active layer 111a is disposed on the substrate 100 of the pixel region P and an active layer 111b on the substrate 100 of the driving circuit region D. The active layer 111a may comprise a channel region 113a and a pair of source/drain regions 113b separated by the channel region 113a. The other active layer 111b may also comprise a channel region 113c and a pair of source/drain regions 113d separated by the channel region 113c. In this embodiment, the channel region 113a comprises dopants with a first conductivity type and a second conductivity type opposite to the first conductivity type. For example, the first conductivity type is N-type and dopants with the first conductivity type comprise phosphor. The second conductivity type is P-type and dopants with the second conductivity type comprise boron. The channel region 113c may be an intrinsic channel region or comprise dopants with only one conductivity type, such as N-type or P-type.

Fabrication of two gate structures are disposed on the active layers 111a and 111b, respectively, thus TFTs are complete. The TFT in the pixel region P may comprise a NMOS or a CMOS. The TFT in the driving circuit region D may comprise a NMOS, a PMOS, or a CMOS. The gate structure disposed on the active layer 111a comprises a stack of a gate dielectric layer 112 and a gate layer 114. The gate structure disposed on the active layer 111b also comprises a stack of the gate dielectric layer 112 and a gate layer 116.

Figure 1B:
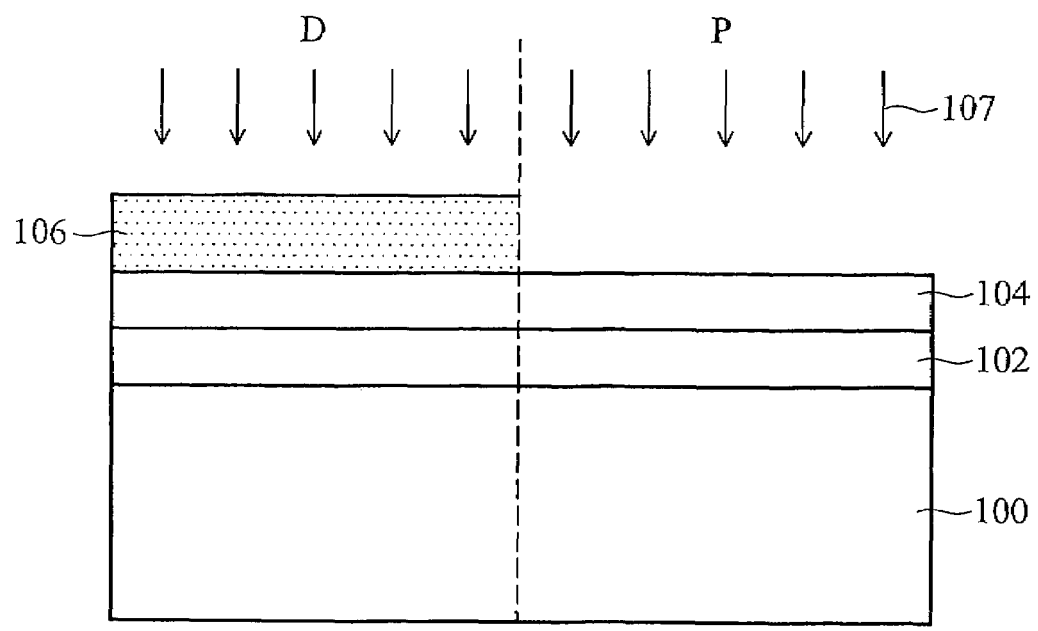
Figure 1C:
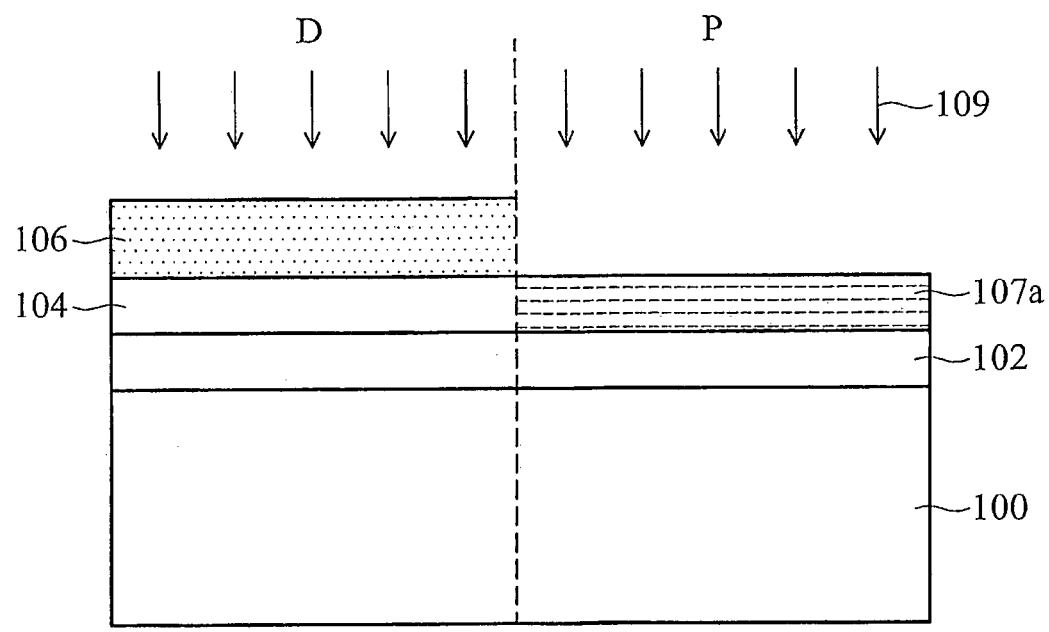
Figure 1D:
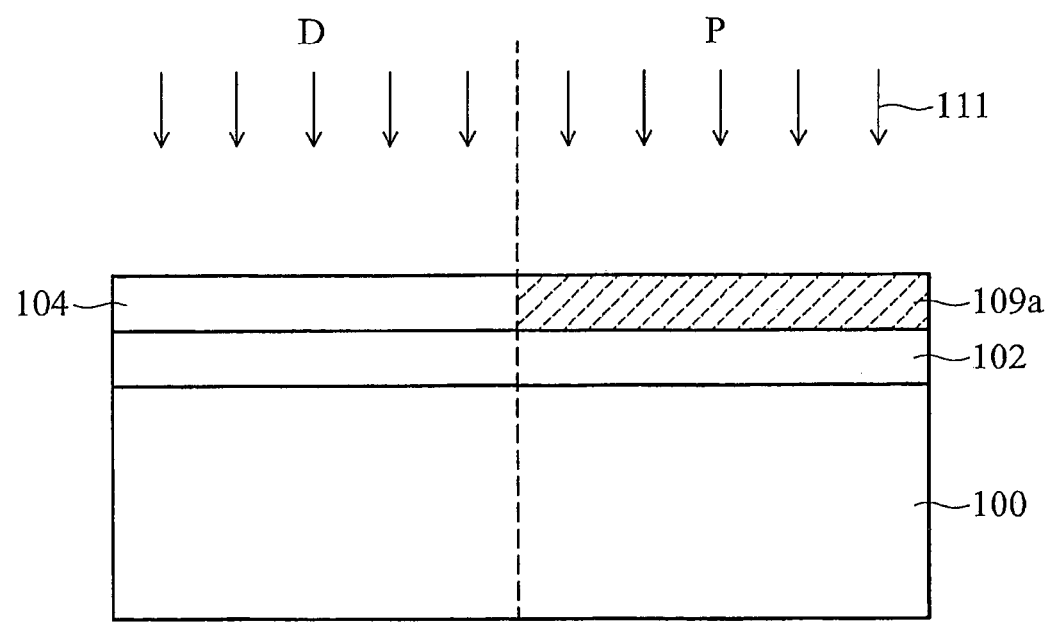
Figure 1E:
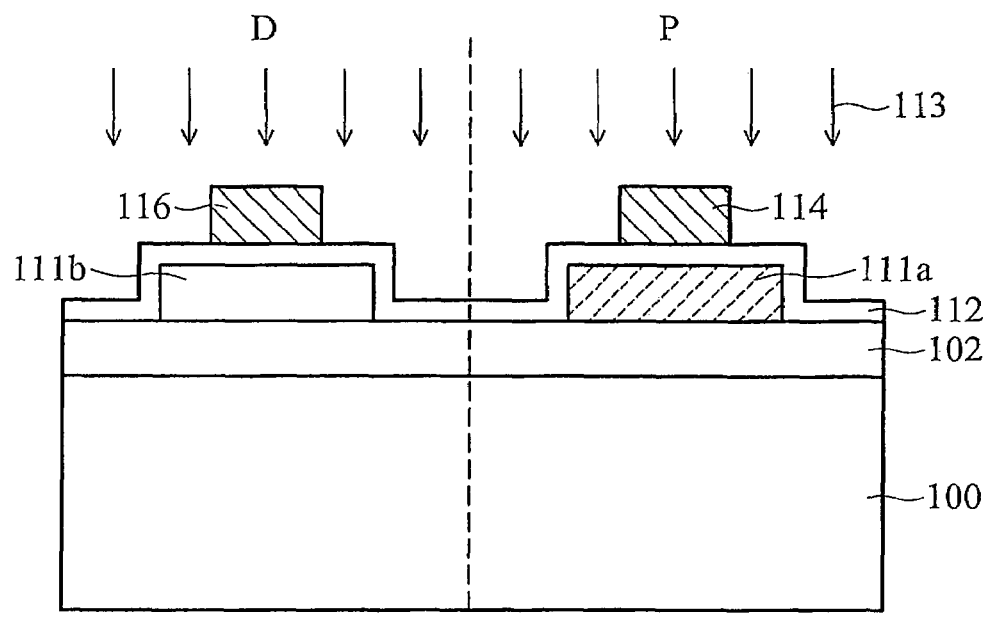
Figure 1F:
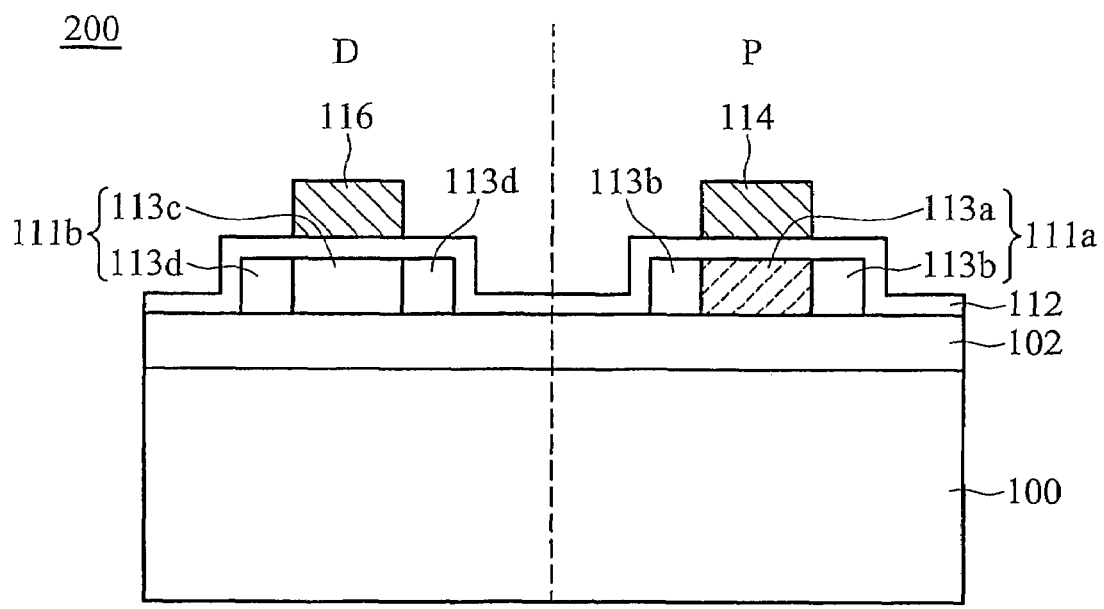

Referring to FIGS. 1A to 1F, which illustrate an embodiment of a method for fabricating a system for displaying images incorporating a thin film transistor device. In FIG. 1A, a substrate 100 comprising a driving circuit region D and a pixel region P is provided. The substrate 100 may comprise glass, quartz, or plastic. A buffer layer 102 may be optionally formed on the substrate 100 to serve as an adhesion layer or a contamination barrier layer between the substrate 100 and the subsequent layer formed thereon. The buffer layer 102 may be a single layer or multiple layers. For example, the buffer layer 102 may comprise silicon oxide, silicon nitride, or a combination thereof.

A layer 104 is formed on the substrate 100 of the driving circuit and pixel regions D and P. In this embodiment, the layer 104 may comprise polysilicon and may be formed by a conventional low temperature polysilicon (LTPS) process. For example, an amorphous silicon layer (not shown) is formed on the substrate 100. A laser annealing treatment, such as an excimer laser annealing (ELA) treatment, is performed, such that the amorphous silicon layer is transformed into a polysilicon layer. Next, a channel doping process may be optionally performed on the polysilicon layer 104.

In FIG. 1B, a masking layer 106 is formed on the polysilicon layer 104 in the driving circuit region D to expose the polysilicon layer 104 in the pixel region P. The masking layer 106 may be formed by conventional lithography. Ion implantation 107 of a first conductivity type is performed on the exposed polysilicon layer 104 in the pixel region P. For example, the ion implantation 107 can employ phosphor ions or other N-type elements with an implant dosage of $1 \times 10^{11} \sim 1 \times 10^{13}$ ion/cm$^2$. The lattice structure of the exposed polysilicon layer 104 is damaged due to the ion bombardment, thus a damage region 107a is formed in the exposed polysilicon layer 104 in the pixel region P, as shown in FIG. 1C. In the damage region 107a, defect density of the polysilicon layer 104 is increased to increase the grain-boundary capacitance thereof. Typically, the grain-boundary capacitance is proportional to the sub-threshold swing. Accordingly, a higher sub-threshold swing can result when the defect density in the polysilicon layer serving as an active layer for a thin film transistor (TFT) is increased.

Additionally, the difference between the number of electrons and holes in the damage region 107a may be increased due to performance of the ion implantation 107 of the first conductivity type. As a result, the threshold voltage of the TFT drifts which is undesirable for circuit design. In order to address this problem, in this embodiment, ion implantation 109 of a second conductivity type opposite to the first conductivity type is performed in the damage region 107a of the polysilicon layer 104 in the pixel region P. For example, the ion implantation 109 can employ boron ions or other P-type elements with an implant dosage of $1 \times 10^{11} \sim 1 \times 10^{13}$ ion/cm$^2$, as shown in FIG. 1C, such that the damage region 107a of the polysilicon layer 104 in the pixel region P comprises dopants with the first and second conductivity types, in which the dopants with the first conductivity type is provided by ion implantation 107. Here, the polysilicon layer comprising dopants with the first and second conductivity types is labeled 109a, as shown in FIG. 1D. The provision of dopants with the second conductivity type can compensate for drift of threshold voltage due to reduction of the difference between the number of electrons and holes in the polysilicon layer 109a. In some embodiments, the ion implantation 107 can be performed by P-type elements and the subsequent ion implantation 109 can be performed by N-type elements.

As shown in FIG. 1D, after completion of the on implantation 109, the masking layer 106 shown in FIG. 1C is removed. Next, a heat treatment 111 is performed on the polysilicon layer 104 and 109a. For example, the heat treatment 111 can be performed by conventional rapid thermal annealing (RTA) at a temperature of about 300° C. to 600° C., to activate the dopants and repair the lattice structure of the polysilicon layer 109a in the pixel region P. After completion of the heat treatment 111, dopants can be bonded with silicon atoms in the polysilicon layer 109a to increase the stability of the polysilicon layer 109a. Moreover, some lattice defects may still remain in the polysilicon layer 109a after repair of the lattice structure, thereby increasing sub-threshold swing. In some embodiments, the heat treatment 111 can be performed in subsequent TFT fabrication steps. For example, the heat treatment 111 can be performed after formation of the gate structure for the TFT.

As shown in FIG. 1E, the polysilicon layer 104 and 109a shown in FIG. 1D is subsequently patterned to respectively form polysilicon pattern layers 111a and 111b in the pixel region P and in the driving circuit region D. The polysilicon pattern layers 111a and 111b serve as active layers for TFTs in the pixel region P and in the driving circuit region D. Next, an insulating layer 112 and a conductive layer (not shown) are successively formed on the active layers 111a and 111b and the buffer layer 102. In this embodiment, the insulating layer 112 serves as a gate dielectric and may be a single layer or multiple layers. For example, the insulating layer 112 may comprise silicon oxide, silicon nitride, or a combination thereof. The insulating layer 112 can be formed by conventional deposition, such as chemical vapor deposition (CVD). The conductive layer may comprise metal, such as molybdenum (Mo) or Mo alloy. The conductive layer can be formed by CVD or sputtering. The conductive layer is etched to form gate layers 114 and 116 overlying the active layers 111a and 111b, respectively. Heavy-ion implantation 113 is subsequently performed in the active layers 111a and 111b using the gate layers 114 and 116 as implantation masks.

After completion of the heavy-ion implantation 113, a channel region 113a is formed in the active layer 111a under the gate layer 114 and a pair of source/drain regions 113b is formed in the active layer 111a and separated by the channel region 113a. Moreover, a channel region 113c is formed in the active layer 111b under the gate layer 116 and a pair of source/drain regions 113d is formed in the active layer 111b and separated by the channel region 113c, as shown in FIG. 1F. Thus, a thin film transistor device 200 of the invention is complete.

According to the invention, since some lattice defects remain in the active layer 111a in the pixel regions P, the pixel TFT can have a higher sub-threshold swing than the TFT in the driving circuit region D. Accordingly, the TFT device can have different electrical characteristics in driving circuit and pixel regions D and P. Moreover, a higher sub-threshold swing for the pixel TFT can increase gray scale inversion of display device, thereby providing high contrast ratio for display devices without degrading the electrical characteristics of the drive TFT. Additionally, because the channel region 113a in the active layer 111a in the pixel regions P comprises N and P-type dopants, the threshold voltage of the pixel TFT can be prevented from drifting.

Figure 2:
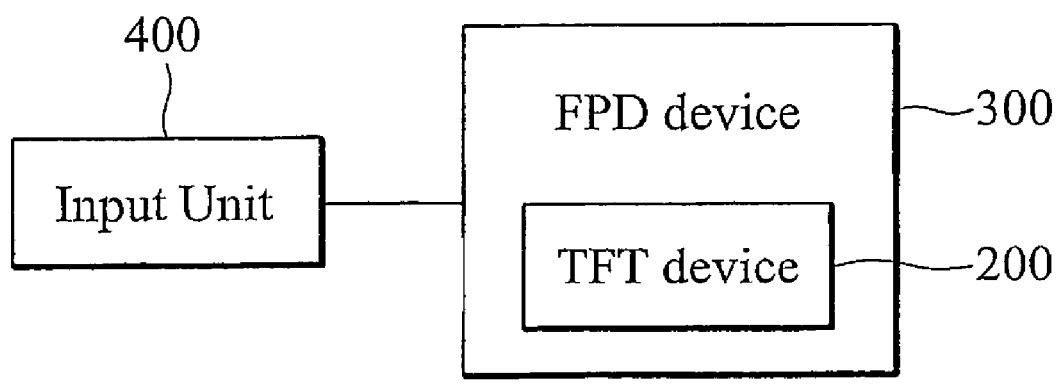
FIG. 2 schematically shows another embodiment of a system for displaying images.

FIG. 2 schematically shows another embodiment of a system for displaying images which, in this case, is implemented as a flat panel display (FPD) device 300 or an electronic device 500 such as a laptop computer, a mobile phone, a digital camera, a personal digital assistant (PDA), a desktop computer, a television, a car display or a portable DVD player. The described TFT device can be incorporated into the flat panel display device 300 that can be an LCD or OLED panel. As shown in FIG. 2, the FPD device 300 may comprise a TFT device, such as a TFT device 200 shown in FIG. 1F. In some embodiments, the TFT device 300 can be incorporated into the electronic device 500. As shown in FIG. 2, the electronic device 500 comprises the FPD device 300 and an input unit 400. Moreover, the input unit 400 is coupled to the FPD device 300 and operative to provide input signals (e.g. image signals) to the FPD device 300 to generate images.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
   a substrate comprising a pixel region;
   a thin film transistor device located in the pixel region, comprising:
       an active layer disposed on the substrate of the pixel region, comprising a channel region, a pair of source/drain regions separated by the channel region; and
       a gate structure disposed on the active layer, comprising a stack of a gate dielectric layer and a gate layer;
   wherein the channel region comprises dopants with a first conductivity type and a second conductivity type opposite to the first conductivity type; and
   another thin film transistor device located outside of the pixel region, which comprises a channel region comprising dopant with only a single conductivity type.

2. The system as claimed in claim 1, wherein the active layer comprises low temperature polysilicon.

3. The system as claimed in claim 1, wherein the gate layer comprises molybdenum.

4. The system as claimed in claim 1, wherein the gate dielectric layer comprises silicon oxide, silicon nitride or a combination thereof.

5. The system as claimed in claim 1, wherein the first conductivity type is N-type and the second conductivity is P-type.

6. The system as claimed in claim 5, wherein the buffer layer comprises silicon oxide, silicon nitride or a combination thereof.

7. The system as claimed in claim 1, further comprising a buffer layer disposed between the substrate and the active layer.

8. The system as claimed in claim 1, further comprising:
   a flat panel display device comprising the thin film transistor device; and
   an input unit coupled to the flat panel display device and operative to provide input to the flat panel display device, such that the flat panel display device displays images.

9. The system as claimed in claim 8, wherein the system comprises an electronic device comprising the flat panel display device.

10. The system as claimed in claim 9, wherein the electronic device is a laptop computer, a mobile phone, a digital camera, a personal digital assistant, a desktop computer, a television, a car display or a portable DVD player.

11. The system as claimed in claim 1, wherein dopants with both first and second conductivity types are within the channel region in the active layer of the thin film transistor device.

12. The system as claimed in claim 11, wherein the first conductivity type is N-type, and the second conductivity type is P-type.

13. The system as claimed in claim 1, wherein the first conductivity type is N-type, and the second conductivity type is P-type.

14. The system as claimed in claim 1, wherein said another thin film transistor device is located in a driving circuit region.

15. A method for fabricating a system for displaying images, comprising:
   (a) providing a substrate comprising a pixel region;
   (a) forming a thin film transistor device in the pixel region, comprising:
       disposing an active layer on the substrate of the pixel region, comprising a channel region, a pair of source/drain regions separated by the channel region; and
       disposing a gate structure on the active layer, comprising a stack of a gate dielectric layer and a gate layer;
       wherein the channel region comprises dopants with a first conductivity type and a second conductivity type opposite to the first conductivity type; and
   (c) forming another thin film transistor device located outside of the pixel region, which comprises a channel region comprising dopant with only a single conductivity type.

16. The method as claimed in claim 15, wherein dopants with both first and second conductivity types are within the channel region in the active layer of the thin film transistor device.

17. The method as claimed in claim 15, wherein the first conductivity type is one of N-type and P-type, and the second conductivity type is other one of N-type or P-type.

18. The method as claimed in claim 15, wherein the active layer comprises low temperature polysilicon.

19. The system as claimed in claim 15, wherein the gate layer comprises molybdenum.

20. The system as claimed in claim 15, wherein the gate dielectric layer comprises silicon oxide, silicon nitride or a combination thereof.

* * * * *